United States Patent [19]
Kitamura

[11] 3,932,884
[45] Jan. 13, 1976

[54] MIS TYPE INTEGRATED CIRCUIT DEVICE

[75] Inventor: Yoshishige Kitamura, Tokyo, Japan

[73] Assignee: Nippon Electric Co., Inc., Tokyo, Japan

[22] Filed: Mar. 5, 1974

[21] Appl. No.: 448,258

[30] Foreign Application Priority Data
Mar. 14, 1973 Japan............................ 48-30301

[52] U.S. Cl. .................. 357/41; 357/23; 357/42; 307/304
[51] Int. Cl.² ................ H01L 27/02; H01L 29/78; H03K 3/353
[58] Field of Search........ 357/41, 42, 86; 307/304 T

[56] References Cited
UNITED STATES PATENTS 3,434,068  3/1969  Sevin ................................. 330/28
3,787,717  1/1974  Fischer et al. ....................... 357/86

*Primary Examiner*—Stanley D. Miller, Jr.
*Assistant Examiner*—E. Wojciechowicz
*Attorney, Agent, or Firm*—John M. Calimafde; Robert A. Schroeder

[57] ABSTRACT

A metal-insulator-semiconductor type integrated circuit includes a semiconductor substrate of a first conductivity type and a power supply for a back-gate bias. The substrate is connected to the power supply by a switching means. A region of a second conductivity type, which is grounded, is formed on a major surface of the substrate. The potential of the semiconductor substrate is clamped at a predetermined level by a clamping means connected between the above-mentioned region and the substrate.

5 Claims, 8 Drawing Figures

MIS TYPE INTEGRATED CIRCUIT DEVICE

BACKGROUND OF THE INVENTION

This invention relates generally to MIS (Metal-Insulator-Semiconductor) type integrated circuit devices, and more particularly to an improved MIS type integrated circuit device in which a semiconductor substrate is supplied with a bias voltage which increases the threshhold voltage of MIS type transistors included in the integrated circuit (hereinbelow referred to as a back-gate bias).

Since positive charges tend to be accumulated in a silicon oxide film used as a gate insulating film in MIS type integrated circuit devices, the semiconductor surface just beneath the gate insulating film of an N-channel MIS type transistor is easily converted to N type. Therefore, an N-channel MIS type transistor inevitably becomes the depletion type, even if the gate voltage is maintained at zero volts. MIS type transistors of the enhancement type needed for digital IC applications can be obtained by the application of a back-gate bias to the semiconductor substrate. With the back-gate bias applied to the semiconductor substrate in an integrated circuit device incorporating MIS type transistors, both the threshhold voltage (hereinafter abbreviated as VT1) of the MIS type transistor in the circuit and the threshhold voltage (hereinafter abbreviated as VT2) of a parasitic transistor to be formed between adjacent diffused regions in the semiconductor substrate can be made higher than that which can be obtained with the semiconductor substrate grounded, thereby widening the operating range of the circuit.

Suppose now that such an MIS type integrated circuit device incorporating N-channel MIS type transistors is operated with the back-gate bias applied to the P type semiconductor substrate and used with the substrate in an unbiased condition as a result of a delay in the application of the back-gate bias voltage at the moment the power supply is applied to the circuit of the device. This causes positive charges to leak from P-N junctions and channel portions in the circuit to the substrate. Since the charges flow toward grounded N type regions through the P-N junctions formed between the substrate and the grounded N type regions, the polarity of the potential of the substrate will become that of the circuit power supply potential for the presence of the voltage vs. current characteristics of the P-N junctions to reach a value of the order of for example, +0.5 volts. Because of this phenomenon, $VT_2$ is lowered further than expected in a case in which the substrate and the grounded region are equipotential, thus resulting in degradation in electrical isolation between transistors. Consequently, current flows in portions of the integrated circuit which should be essentially isolated electrically, and the circuit current abnormally increases, which may affect the life span of the integrated circuit.

Power supply devices conventionally used are so contrived that the back-gate bias can be applied to the substrate prior to the application of a voltage to the circuit. Such devices are invariably expensive as compared to ordinary devices. The same problem mentioned above has also arisen in cases in which an MIS type integrated circuit device is used under a condition of power supply application with the substrate kept released from the back-gate bias.

It is consequently an object of this invention to provide an MIS type integrated circuit device, in which the substrate potential does not increase toward the potential of the circuit power supply when the semiconductor substrate is in an electrically floating state and the possibility of an excessive increase in current flowing in the circuit is eliminated.

SUMMARY OF THE INVENTION

An MIS type integrated circuit device according to this invention comprises a semiconductor substrate of a first conductivity type connected through switching means to a first power supply for a back-gate bias, a grounded first region of a second opposite conductivity type extending inwardly from a major surface of the substrate, a clamp means connected between the first region and the substrate for clamping the substrate potential at a predetermined value, and a second region of the opposite conductivity type also extending inwardly from the major surface of the substrate and connected to an additional second power supply opposite in polarity to said first power supply, whereby the clamp means clamps the potential of the semiconductor substrate at a potential between +0.1 volts and −0.1 volts when the switching means is open.

While either an MIS type transistor of the depletion mode or a resistance element may be employed as the clamp means, as will be explained later by reference to specific embodiments of this invention, the use of a depletion type transistor is advantageous compared to the resistance means in that current flowing in the clamp element becomes extremely small and hence power consumption is minimized, under normal operation — that is, when the back-gate bias, the ground potential and a voltage opposite in polarity to the back-gate bias are applied to the substrate, the first region, and the second region respectively.

According to the MIS type integrated circuit device of this invention, even when the substrate is in the unbiased condition, the differential potential between the substrate and the grounded first region is maintained below 0.1 volts by the clamp means and hence the potential of the substrate is substantially equal to the ground potential.

Therefore, VT2 for electrical isolation between adjacent transistors can be maintained sufficiently high and the possibility of an excessive current flowing into the integrated circuit or the life of the circuit being adversely affected can be eliminated.

Furthermore, it is not necessary to use the expensive power supply device mentioned above so contrived as to apply a backgate bias to the substrate prior to application of a voltage of the circuit power supply.

BRIEF DESCRIPTION OF THE DRAWINGS

For a better understanding of the principles of this invention, a detailed description of various embodiments will be given in conjunction with the accompanying drawings, in which.

DESCRIPTION OF THE PREFERRED EMBODIMENT

Figure 1:
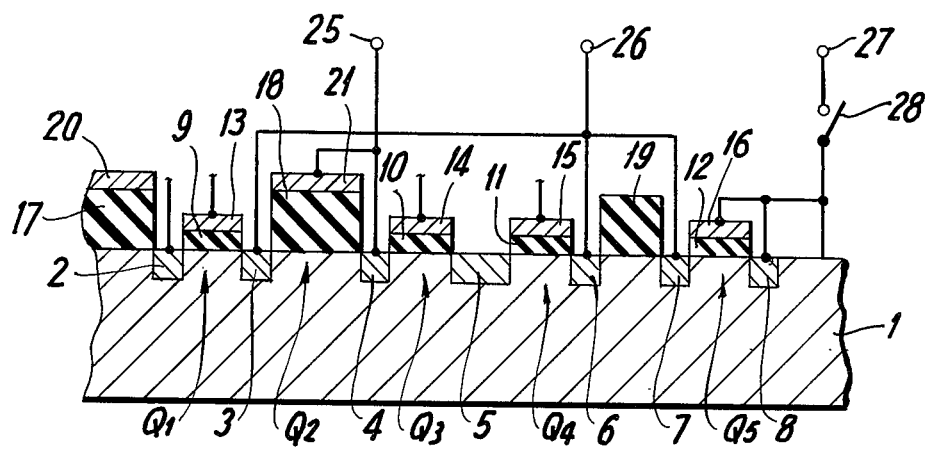
FIG. 1 is a schematic cross-sectional view of an MIS type integrated circuit device according to a first embodiment of this invention.

Referring now to FIG. 1, a highly doped semiconductor regions 2 to 8 of N type and electrically isolated from one another are formed on a major surface of a P type semiconductor substrate 1 by a conventional technique such as selective impurity diffusion.

Silicon oxide films 9, 10, 11, and 12 that serve as the gate insulating films of MIS type transistors are respectively formed on the major surface of the substrate 1 between regions 2 and 3, 4 and 5, 5 and 6, and between 7 and 8. On these silicon oxide films the gate electrodes 13 through 16 are formed respectively. A MIS type transistor Q1 is composed of the N-type regions 2 and 3 and the gate electrode 13. In the same manner, transistors Q3, Q4, and Q5 are formed respectively by the regions 4, 5 and the gate electrode 14; by the regions 5, 6 and the gate electrode 15; and by the regions 7, 8 and the gate electrode 16. Further, thick silicon layers 18 and 19 are formed respectively between the regions 3 and 4 — that is, between the transistors Q1 and Q3, and between the regions 6 and 7 — that is, between the transistors Q4 and Q5, to achieve isolation between transistors. The thick silicon oxide layer 17 is formed as a protective film on the remaining part of the semiconductor surface. A metallic layer 21 is provided on the silicon oxide layer 18. A parasitic transistor Q2 is formed by the metallic layer 21, the regions 3 and 4, and the oxide film 18. A metallic layer 20 is also provided on the protective film 17.

Figure 2:
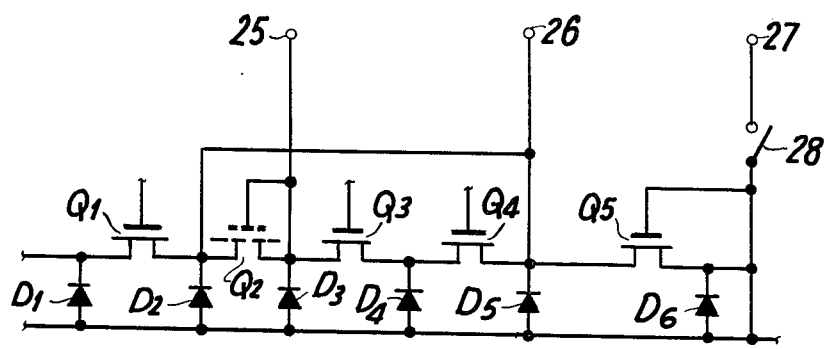
FIG. 2 is an equivalent circuit diagram of the device shown in FIG. 1.

The structure shown in FIG. 1 may be represented by an equivalent circuit shown in FIG. 2. As illustrated, the PN junctions formed by the P-type substrate 1 and the N-type regions 2 through 8 are represented by the diodes D1 through D6, respectively. The drain region 4 of the transistor Q3 is connected to a positive power supply 25 and at the same time, to the metallic layer 21, thereby forming the parasitic transistor Q2 as mentioned previously. The source regions 3 and 6 of the transistors Q1 and Q4 are both connected to the ground terminal 26 to become the grounded regions, and the substrate 1 is connected via a switch 28 to a power supply 27 for a negative back-gate bias.

In this embodiment, the depletion mode N-channel transistor Q5 is connected as a clamp means between the grounded regions, 3 and 6, and the substrate. Thus, the drain region 7 of the transistor Q5 is connected to the ground terminal 26 and both the source region 8 and the gate electrode 16 are connected to the substrate 1. It is noted that the transistor Q5 is fabricated simultaneously with the other transistors Q1, Q3, and Q4. In this case, the transistor Q5 will operate in the depletion made, since the gate insulating film 12 thereof is a silicon oxide film and the source region 8 is connected to the substrate 1.

All of the transistors Q1, Q3, and Q4 will be operated in the enhancement mode by a back-gate bias voltage via the switch 28. Each of the transistors Q1, Q3, Q4, and Q5 has a thin gate oxide film and the threshhold voltage VT1. While, the oxide film of the part corresponding to the gate of the parasitic transistor Q2 is thick and its threshhold voltage is expressed as VT2.

Figure 3:
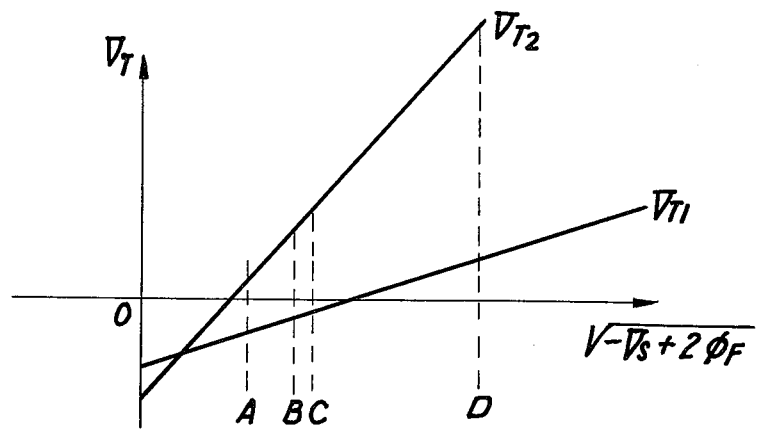
FIG. 3 shows the threshhold voltages of the MIS type transistors as a function of semiconductor substrate voltage.
Figure 4A:
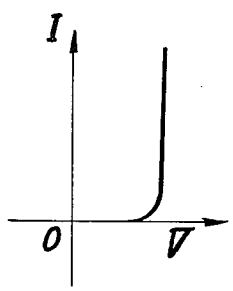
FIGS. 4 (A), (B) and (C) show diagrams illustrating the current vs. voltage characteristic curves of a P-N junction, a MIS type transistor of depletion mode and a resistance element, respectively.

Now operation of the circuit of FIG. 2 will be analyzed with further reference to FIGS. 3 and 4. FIG. 3 illustrates variation of the threshhold voltage VT as a function of the substrate voltage VS. The relationship between VT and VS is given by $$VT = K1 \sqrt{-VS + 2\phi F} + K2 \qquad (1)$$

In equation (1), $\phi F$ denotes the Fermi-level of the substrate, and K1 and K2 are the constants mainly determined by the gate oxide film conditions. Therefore, the linear characteristics depicted in FIG. 3 can be obtained for VT and VS by taking VT and $\sqrt{-VS + 2\phi F}$ as the ordinate and the abscissa, respectively. Under normal operation, the switch 28 is closed so that the device is operated with a back-gate bias applied to the semiconductor substrate 1. Under this condition, which corresponds to the point D in FIG. 3, VT1 takes a low positive voltage and VT2 takes a positive voltage higher than the power supply voltage and hence no current flows in the parasitic MIS type transistor Q2. Assume now that the semiconductor substrate 1 is held at ground potential. This causes both VT1 and VT2 to decrease so that VT1 takes a negative voltage value as shown at point C in FIG. 3. In cases where the switch 28 is open and the transistor Q5 (the clamp means according to this invention) is not connected between the ground terminal 26 and the semiconductor substrate 1, a positive charge that has leaked to the substrate 1 from the high potential part within the semiconductor circuit via the P-N junctions. (D1, D3, and D4) and the MIS transistors (Q1, Q3, and Q4) will flow through the P-N junctions D2 and D5 to the ground terminal 26 which is the lowest potential. The potential of the substrate 1 in this case takes a value between +0.4 and +0.6 volts as shown by the voltage vs. current characteristic of the P-N junction shown at FIG. 4A, VT1 and VT2 taking values in the vicinity of point A on the abscissa of FIG. 3. It shows a further decrease in the values of VT1 and VT2. In this case, VT2 is lowered considerably as compared to the power supply voltage and the electrical resistance of the isolated part Q2 decreases, with the result that an excessive current flows into the integrated circuit.

The transistor Q5 of the depletion type is used as the clamp means according to this invention. Therefore, as shown in the voltage vs. current characteristic of the element Q5 of FIG. 4B, the drain current flows in spite of a slight increase in potential of the substrate 1 and an increase in the substrate potential is suppressed at a sufficiently low value on the order of less than +0.1 volt. In this case, the ground terminal 26 and the substrate 1 become almost equipotential, VT1 and VT2 take values in the vicinity of point B which is close to point C on the abscissa in FIG. 3, with the result that an abnormal current flowing into the integrated circuit is restricted to a value close to that which would be obtained if the substrate 1 were connected to the ground terminal. Accordingly, even when the substrate 1 is freed from the back-gate bias by the switch 28, the electrical resistance of the electrically isolating region Q2 is maintained at a considerably higher value. Therefore, the possibility of an excessive current flowing into the integrated circuit is eliminated.

Figure 5:
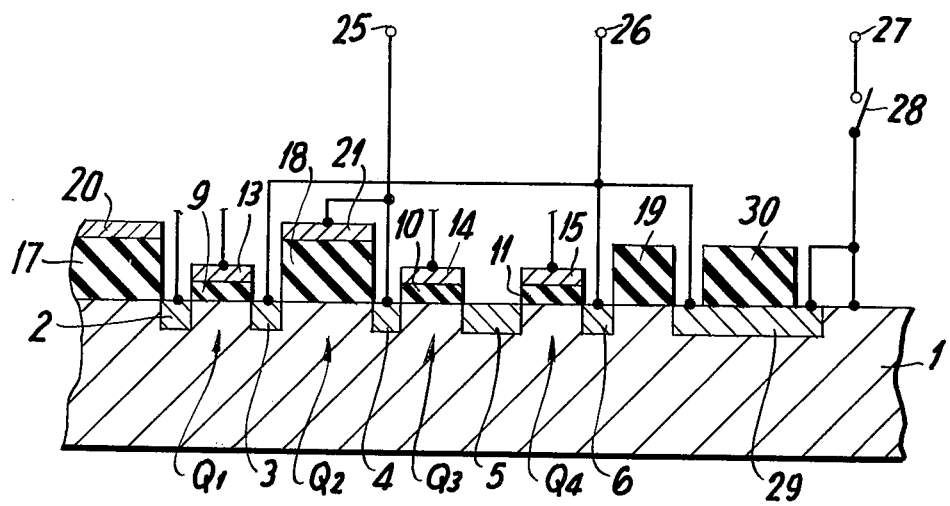
FIG. 5 is a schematic cross-sectional view of an MIS type integrated circuit device according to another embodiment of this invention.
Figure 6:
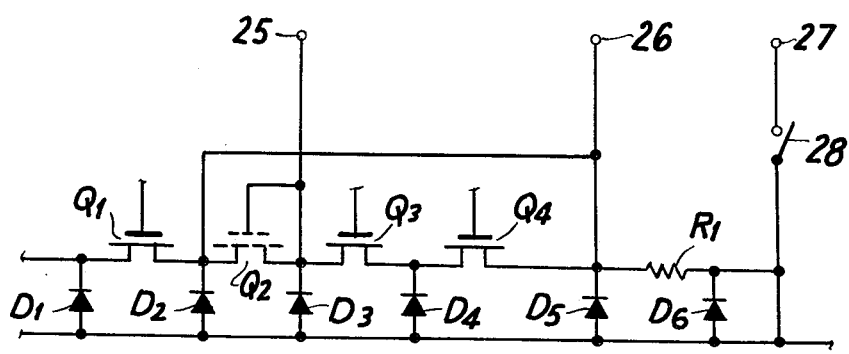
FIG. 6 is an equivalent circuit diagram of the device shown in FIG. 5.

It has been assumed in the foregoing embodiment that the element forming the clamp means is a depletion type transistor, but a resistance element may be substituted of the transistor. An embodiment for this type is shown in FIG. 5 using the reference numerals as in FIG. 1 to identify like components. In this embodiment, it can be seen that a resistance element 29 consisting of an N-type region is formed on the surface of the substrate 1 with one end connected to the ground terminal 26 and the other end connected to the substrate. The reference numeral 30 denotes an insulating protective film formed on the resistance element 29. An equivalent circuit of this device is shown in FIG. 6 which is similar to that shown in FIG. 2, wherein the resistance element 29 is represented by R1. The voltage vs. current characteristic of the resistance element 29 is shown at FIG. 4C. Since the previously mentioned leakage current with the substrate released is extremely small and current flows even in the case of a nominal potential difference on account of the resistance element, the substrate potential can be suppressed below about +0.1 volt in the same manner as mentioned previously.

In the device of FIG. 1 or FIG. 5, when the power supply 25 is +12 volts, the power supply 27 for the back-gate bias is −5 volts and the switch 28 is opened, the current flowing into the integrated circuit is 45 mA when the clamp means Q5 or 29 is not present. In contrast, it is 33 mA under the same conditions when the clamp transistor Q5 is employed according to this invention, the channel being 1,500 $\mu$ in width and 10 $\mu$ in length. The current is 34 mA in the case of employment of the resistance element 29 having a resistive value of 1 K$\Omega$, under the same conditions.

Figure 4B:
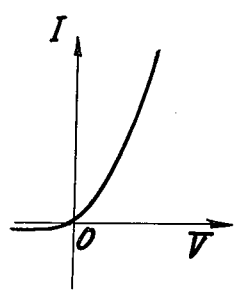
Figure 4C:
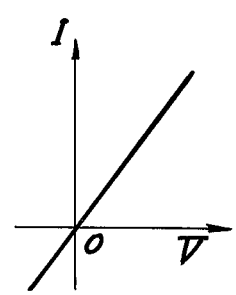

In cases where the depletion type transistor Q5 is used with a negative potential applied to the substrate under normal operation, the backward current barely flows in the transistor Q5 as shown at FIG. 4B and power dissipation of this portion is only nominal, but current proportional to the back-gate bias applied to the substrate flows as indicated at FIG. 4C when the resistance element 29 is employed. Therefore, use of the resistance element 29 slightly increases the power dissipation, as compared to the use of the depletion type transistor Q5.

While the foregoing descriptions are concerned with integrated circuit devices of the structure including N-channel MIS type transistors, this invention can be applied to an integrated circuit device comprising P-channel MIS type transistors. In the latter case, a depletion type transistor must be also used as the clamp means. It has been publicly known that, in order to make a P-channel MIS type transistor used as a clamp means operate as a depletion type transistor, boron is injected into a channel region just beneath a gate insulating film by the ion implantation process so as to form a P-type region with a low impurity concentration. As a matter of course, the application of a positive voltage as a back-gate bias and a negative voltage as a circuit power supply voltage is needed in this case. Therefore, the substrate potential is suppressed below about −0.1 volt when the substrate is free from the back-gate bias.

Although both embodiments described above are concerned with the formation of the clamp means within the semiconductor substrate of an integrated circuit device, the structural modification of connecting an independently prepared clamp element across the ground terminal 26 and the semiconductor substrate could be made without departing from the essential scope of the present invention.

It will thus be appreciated that variations and modifications of the embodiments of the invention herein specifically described may be made by those skilled in the art to which the present invention pertains, all without departing from the spirit and scope of the invention.

What is claimed is:

1. A metal-insulator-semiconductor integrated circuit device comprising a semiconductor substrate of a first conductivity type, a plurality of metal-insulator-semiconductor transistors each having regions of a second conductivity type opposite to the first forming a source and a drain on a major surface of said substrate, means for grounding a first portion of said regions belonging to one of said transistors, means for applying a voltage to a second region belonging to a different one of said transistors, said first and second regions being disposed in such relationship that a leakage current flows between them if the absolute potential of said semiconductor substrate exceeds a first predetermined value, and means for clamping the potential of said semiconductor substrate at a second predetermined value closer to the ground potential than said first value predetermined to prevent said substrate from exceeding said first predetermined value, said clamping means being connected between the ground potential and said substrate.

2. The circuit according to claim 1, further comprising a power supply for giving said substrate a back-gate-bias, and switching means for connecting said substrate to said power supply, wherein the potential of said substrate is clamped at said second predetermined value by said clamping means and said leakage current is thereby prevented from flowing between said first and second regions when said switching means is open.

3. The circuit according to claim 2, wherein said second predetermined value ranges between about +0.1 volt and −0.1 volt.

4. The circuit according to claim 1, wherein said clamping means includes a metal-insulator-semiconductor type transistor of the depletion mode formed on said major surface of said substrate having a source region, a drain region, and a gate electrode, said drain region being connected to said first region, and said source region and said gate electrode being connected in common to said substrate.

5. The metal-insulator-semiconductor type integrated circuit device according to claim 1, wherein said clamping means comprises a resistance element with one end thereof connected to said first region and the other end thereof connected to said semiconductor substrate.

* * * * *

UNITED STATES PATENT OFFICE
CERTIFICATE OF CORRECTION

Patent No. 3,932,884  Dated  January 13, 1976

Inventor(s)  Yoshishige Kitamura

It is certified that error appears in the above-identified patent and that said Letters Patent are hereby corrected as shown below:

The assignee of the patent is:

--Nippon Electric Company, Limited--.

Signed and Sealed this

Third Day of August 1976

[SEAL]

Attest:

RUTH C. MASON
Attesting Officer

C. MARSHALL DANN
Commissioner of Patents and Trademarks